(12) United States Patent
Yamada et al.

(10) Patent No.: US 7,384,280 B2
(45) Date of Patent: Jun. 10, 2008

(54) ANISOTROPIC CONDUCTIVE CONNECTOR AND INSPECTION EQUIPMENT FOR CIRCUIT DEVICE

(75) Inventors: Daisuke Yamada, Hidaka (JP); Kiyoshi Kimura, Hidaka (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/571,935

(22) PCT Filed: Jul. 15, 2004

(86) PCT No.: PCT/JP2004/010119

§ 371 (c)(1),
(2), (4) Date: Jan. 11, 2007

(87) PCT Pub. No.: WO2006/008784

PCT Pub. Date: Jan. 26, 2006

(65) Prior Publication Data

US 2007/0281516 A1    Dec. 6, 2007

(51) Int. Cl.
    *H01R 4/58* (2006.01)
(52) U.S. Cl. ....................................................... 439/91
(58) Field of Classification Search ............ 439/89–91, 439/591
    See application file for complete search history.

(56) References Cited

U.S. PATENT DOCUMENTS 4,209,481 A * 6/1980 Kashiro et al. ........ 264/272.11
5,474,458 A * 12/1995 Vafi et al. .................... 439/91
5,576,519 A * 11/1996 Swamy ...................... 174/265
5,688,584 A * 11/1997 Casson et al. .............. 428/209
7,059,874 B2 * 6/2006 Weiss ........................... 439/91

FOREIGN PATENT DOCUMENTS

| JP | 11 204176  | 7/1999  |
| JP | 11 273772  | 10/1999 |
| JP | 2000 353556 | 12/2000 |
| JP | 2001 351702 | 12/2001 |

* cited by examiner

*Primary Examiner*—Briggitte R. Hammond
(74) *Attorney, Agent, or Firm*—Oblon, Spivak, McClelland, Maier & Neustadt, P.C.

(57) ABSTRACT

An anisotropically conductive connector device including a first anisotropically conductive sheet and a second anisotropically conductive sheet. A plurality of conductive path-forming parts each extending in a thickness-wise direction of each sheet are arranged in a state mutually insulated d by an insulating part. The conductive path-forming parts in the second anisotropically conductive sheet each have a diameter smaller than a diameter of each of the conductive path-forming parts in the first anisotropically conductive sheet.

7 Claims, 4 Drawing Sheets

ANISOTROPIC CONDUCTIVE CONNECTOR AND INSPECTION EQUIPMENT FOR CIRCUIT DEVICE

TECHNICAL FIELD

The present invention relates to an anisotropically conductive connector device suitable for use in, for example, inspection of circuit devices such as semiconductor integrated circuits and an inspection apparatus for circuit devices, which is equipped with this anisotropically conductive connector device, and particularly to an anisotropically conductive connector device and an inspection apparatus for circuit devices which can be suitably used in inspection of circuit devices such as semiconductor integrated circuits having projected electrodes.

BACKGROUND ART

An anisotropically conductive sheet is a sheet exhibiting conductivity only in its thickness-wise direction or having pressure-sensitive conductive conductor parts exhibiting conductivity only in the thickness-wise direction when they are pressed in the thickness-wise direction. As such anisotropically conductive sheets, there have been known those of various structures, such as those obtained by uniformly dispersing metal particles in an elastomer (see, for example, Patent Art. 1), those obtained by unevenly dispersing a conductive magnetic metal in an elastomer, thereby forming a great number of conductive path-forming parts each extending in a thickness-wise direction thereof and an insulating part for mutually insulating them (see, for example, Patent Art. 2) and those obtained by defining a difference in level between the surface of each conductive path-forming part and an insulating part (see, for example, Patent Art. 3).

In these anisotropically conductive sheets, conductive particles are contained in an insulating elastic polymeric substance in a state oriented so as to align in the thickness-wise direction, and each conductive path is formed by a chain of a great number of conductive particles.

Since such an anisotropically conductive sheet has such features that compact electrical connection can be achieved without using any means such as soldering or mechanical fitting, and that soft connection becomes feasible with mechanical shock or strain absorbed therein, it is widely used as an anisotropically conductive connector for achieving electrical connection between circuit devices, for example, electrical connection between a printed circuit board and a leadless chip carrier, liquid crystal panel or the like, in fields of, for example, electronic computers, electronic digital clocks, electronic cameras and computer key boards.

Further, as a means for achieving electrical connection between electrodes to be inspected of a circuit device, which is an object of inspection, and electrodes for inspection formed on the front surface of a circuit board for inspection in electrical inspection of circuit devices such as printed circuit boards and semiconductor integrated circuits, an anisotropically conductive sheet is used in place of a probe member, in which a plurality of pin probes are arranged corresponding to the electrode to be inspected.

That, in which either the probe member or the anisotropically conductive sheet may be used, is known as an inspection apparatus for circuit devices. A circuit board for inspection in this inspection apparatus has inspection electrodes each having a special form. An examples thereof is illustrated in FIG. 13. The inspection electrodes 6 in this circuit board 5 for inspection each have a cocoon-shaped form and are arranged in accordance with a pattern corresponding to a pattern of the electrodes to be inspected in a state inclined at an angle of, for example, 45°.

However, the inspection apparatus having the circuit board for inspection, in which the inspection electrodes of such a special form have been formed has been proved to involve the following problems when electrical inspection of a circuit device having projected electrodes, such as BGA, is conducted by using the anisotropically conductive sheet.

As the anisotropically conductive sheet in the inspection apparatus of the circuit board, is used that having conductive path-forming parts each having a diameter equivalent to the diameter of an electrode to be inspected in that high conductivity is achieved. However, in the circuit board 5 for inspection illustrated in FIG. 13, a pitch of the inspection electrodes 6, i.e., a center distance between inspection electrodes 6 adjoining each other, is substantially equal to a pitch of the electrodes to be inspected, but a clearance between inspection electrodes 6 adjoining each other is considerably smaller than a clearance between the electrodes to be inspected. Therefore, it is extremely difficult to arrange the anisotropically conductive sheet on the circuit board 5 for inspection in such a manner that each of the conductive path-forming parts thereof is located on an inspection electrode 6 to be connected and come into no contact with inspection electrodes 6 adjoining the inspection electrode.

In addition, when an anisotropically conductive sheet having conductive path-forming parts small in diameter is used, it is necessary to make the thickness of the conductive path-forming parts of the anisotropically conductive sheet small for the purpose of achieving necessary conductivity. However, the anisotropically conductive sheet having the conductive path-forming parts small in the thickness thereof is low in irregularity-absorbing property, so that it is difficult to surely achieve electrical connection to electrodes to be inspected when a circuit board, which is an object of inspection, has projected electrodes great in a scatter of projected height.

Patent Art. 1: Japanese Patent Application Laid-Open No. 93393/1976;
Patent Art. 2: Japanese Patent Application Laid-Open No. 147772/1978;
Patent Art. 3: Japanese Patent Application Laid-Open No. 250906/1986.

DISCLOSURE OF THE INVENTION

The present invention has been made on the basis of the foregoing circumstances and has as its first Object the provision of an anisotropically conductive connector devices by which necessary electrical connection can be surely achieved even when electrodes to be inspected of a circuit device, which is an object of inspection, are those projected in the case where it is used in electrical inspection of the circuit device, a circuit board for inspection has inspection electrodes each having a special form, and a clearance between inspection electrodes adjoining each other is small, and moreover necessary conductivity can be attained.

A second object of the present invention is to provide an inspection apparatus for circuit devices, which is equipped with the above-described anisotropically conductive connector device.

An anisotropically conductive connector device according to the present invention comprises a first anisotropically conductive sheet and a second anisotropically conductive sheet, in which a plurality of conductive path-forming parts each extending in a thickness-wise direction of each sheet are arranged in a state mutually insulated by an insulating part, wherein the conductive path-forming parts in the second anisotropically conductive sheet each have a diameter smaller than a diameter of each of the conductive path-forming parts in the first anisotropically conductive sheet.

In the anisotropically conductive connector device, it may be preferable that a sheet-like connector for electrically connecting the first anisotropically conductive sheet to the second anisotropically conductive sheet be provided between the anisotropically conductive sheets.

The sheet-like connector may preferably be composed of an insulating sheet and a plurality of electrode structures each extending through in a thickness-wise direction of the insulating sheet.

In each of the electrode structures in the sheet-like connector, a front-surface electrode part exposed to the front surface of the insulating sheet and a back-surface electrode part exposed to the back surface of the insulating sheet may preferably be connected to each other through a short circuit part extending through in the thickness-wise direction of the insulating sheet.

An anisotropically conductive connector device according to the present invention comprises a sheet-like connector composed of an insulating sheet and a plurality of electrode structures each extending through in a thickness-wise direction of the insulating sheet, a first anisotropically conductive sheet provided on the front surface of the sheet-like connector and a second anisotropically conductive sheet provided on the back surface of the sheet-like connectors wherein in each of the electrode structures in the sheet-like connector, a front-surface electrode part exposed to the front surface of the insulating sheet and a back-surface electrode part exposed to the back surface of the insulating sheet are connected to each other through a short circuit part extending through in the thickness-wise direction of the insulating sheet, the first anisotropically conductive sheet is composed of a plurality of conductive path-forming parts, which are arranged in accordance with a pattern corresponding to the electrode structures in the sheet-like connector and each extend in a thickness-wise direction of the anisotropically conductive sheet, and an insulating part mutually insulating these conductive path-forming parts, and is arranged in such a manner that the conductive path-forming parts are respectively located on the front-surface electrode parts of their corresponding electrode structures, the second anisotropically conductive sheet is composed of a plurality of conductive path-forming parts, which are arranged in accordance with a pattern corresponding to the electrode structures in the sheet-like connector and each extend in a thickness-wise direction of the anisotropically conductive sheet, and an insulating part mutually insulating these conductive path-forming parts, and is arranged in such a manner that the conductive path-forming parts are respectively located on the back-surface electrode parts of their corresponding electrode structures, and the conductive path-forming parts in the second anisotropically conductive sheet each have a diameter smaller than a diameter of each of the conductive path-forming parts in the first anisotropically conductive sheet.

In the anisotropically conductive connector devices according to the present invention, it may be preferable that the first anisotropically conductive sheet and the second anisotropically conductive sheet be each formed by an elastic polymeric substance as a whole, and conductive particles exhibiting magnetism be contained in the conductive path-forming parts thereof.

In the anisotropically conductive connector devices according to the present invention, a ratio of the diameter of each conductive path-forming part in the second anisotropically conductive sheet to the diameter of each conductive path-forming part in the first anisotropically conductive sleet may preferably be 0.3 to 0.9.

In the anisotropically conductive connector devices according to the present invention, a support for supporting the peripheral edge portion of each of the first anisotropically conductive sheet and second anisotropically conductive sheet may preferably be provided at the peripheral edge portion.

The anisotropically conductive connector devices according to the present invention may be each suitable for use as an anisotropically conductive connector device for conducting electrical connection between electrodes to be inspected of a circuit device, which is an object of inspection, and inspection electrodes of a circuit board for inspection by intervening between the circuit device and the circuit board for inspection, and in such an anisotropically conductive connector devices, the first anisotropically conductive sheet may preferably be brought into contact with the circuit device which is an object of inspection.

An inspection apparatus for circuit boards according to the present invention comprises:

a circuit device for inspection having inspection electrodes arranged corresponding to electrodes to be inspected of a circuit device, which is an object of inspection, and the above-described anisotropically conductive connector device arranged on the circuit board for inspection.

In the anisotropically conductive connector devices of the above-described construction, the first anisotropically conductive sheet is arranged between the circuit device, which is the object of inspection, and the circuit board for inspection in the electrical inspection of the circuit device so as to come into contact with the circuit device that is the object of inspection.

In this state, the circuit board for inspection does not come into contact with the first anisotropically conductive sheet, so that conductive path-forming parts each having a diameter sufficiently large according to the diameter of the electrodes to be inspected can be formed in the first anisotropically conductive sheet irrespective of the form of the inspection electrodes in the circuit board for inspection and the size of a clearance between inspection electrodes adjoining each other, whereby the conductive path-forming parts in the first anisotropically conductive sheet can secure a sufficiently large thickness without impairing necessary conductivity, and so even a wide scatter of projected height in electrodes to be inspected can be absorbed by elastic deformation of the conductive path-forming parts. As a result electrical connection to the electrodes to be inspected can be surely achieved.

Since the second anisotropically conductive sheet has the conductive path-forming parts having a diameter smaller than the diameter of the conductive path-forming parts in the first anisotropically conductive sheet, electrical connection of the conductive path-forming parts to inspection electrodes to be connected can be surely achieved without short-circuiting to adjoining electrodes to be inspected even when the inspection electrodes each have a special form and a clearance between adjoining electrodes to be inspected is small. In addition, the circuit device, which is the object of inspection, does not come into contact with the second anisotropically conductive sheet, whereby the thickness of the conductive path-forming parts in the second anisotropically conductive sheet may be small irrespective of the scatter of the projected height of the electrodes to be inspected in the circuit device, so that conductive path-forming parts having necessary conductivity can be obtained.

According to the present invention, there can be provided an anisotropically conductive connector device, by which necessary electrical connection can be surely achieved even when electrodes to be inspected of a circuit device, which is an object of inspection, are those projected in the case where it is used in electrical inspection of the circuit device, a circuit board for inspection has inspection electrodes each having a special form, and a clearance between inspection electrodes adjoining each other is small, and moreover necessary conductivity can be attained, and further an inspection apparatus for circuit devices, which is equipped with such an anisotropically conductive connector device.

DESCRIPTION OF CHARACTERS

Figure 1:
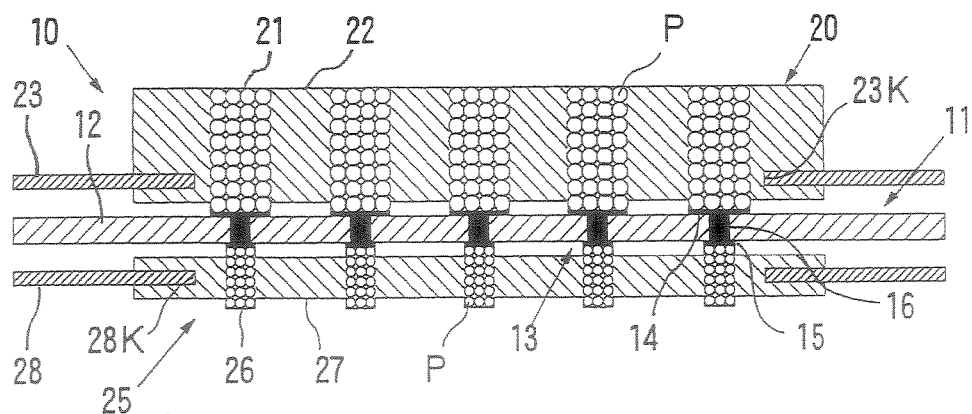
[FIG. 1] is a cross-sectional view illustrating the construction of an exemplary anisotropically conductive connector device according to the present invention.

1 Circuit device
2 Solder ball electrodes
5 Circuit board for inspection
6 Inspection electrodes
9 Guide pins
10 Anisotropically conductive connector device
11 Sheet-like connector
12 Insulating sheet
13 Electrode structures
14 Front-surface electrode parts
15 Back-surface electrode parts
14a, 15a Metal layers
16 Short circuit parts
16H Through-holes
20 First anisotropically conductive sheet
20A First molding material layer
20B Second molding material layer
20C Molding material layer
21 Conductive path-forming parts
22 Insulating part
23 Support
23K Opening
25 Second anisotropically conductive sheet
26 Conductive path-forming parts
27 Insulating part
28 Support
28K Opening
50 Top force
51 Ferromagnetic substance substrate
52 Ferromagnetic substance layers
53 Non-magnetic substance layers
54 Recess
55 Bottom force
56 Ferromagnetic substance substrate
57 Ferromagnetic substance layers
57a Recessed portions
58 Non-magnetic substance layers
59a, 59b Spacers
P Conductive particles
S Molding cavity

MODE FOR CARRYING OUT THE INVENTION

The embodiments of the present invention will hereinafter be described in details.

FIG. 1 is a cross-sectional view illustrating the construction of an exemplary anisotropically conductive connector device according to the present invention. This anisotropically conductive connector device 10 is used in inspection of a circuit device having projected electrodes for conducting electrical connection between electrodes to be inspected of the circuit device and inspection electrodes of a circuit board for inspection by intervening between the circuit device and the circuit board for inspection.

The anisotropically conductive connector device 10 shown in FIG. 1 has a rectangular sheet-like connector 11, a rectangular first anisotropically conductive sheet 20 provided on the front surface of this sheet-like connector 11 and a rectangular second anisotropically conductive sheet 25 provided on the back surface of the sheet-like connector 11.

The sheet-like connector 11 has a rectangular insulating sheet 12, and in this insulating sheet 12, a plurality of electrode structures 13 extending through in a thickness-wise direction of the insulating sheet 12 and composed of a metal are arranged in a state separated from each other in a plane direction of the insulating sheet 12 in accordance with a pattern corresponding to a pattern of electrodes to be connected, specifically, electrodes to be inspected of a circuit device that is an object of inspection.

Each of the electrode structures 13 is formed by integrally connecting a disk-like front-surface electrode part 14 exposed to a front surface (upper surface in FIG. 1) of the insulating sheet 12 and a disk-like back-surface electrode part 15 exposed to a back surface (lower surface in FIG. 1) of the insulating sheet 12 to each other by a short circuit part 16 extending through in the thickness-wise direction of the insulating sheet 12.

In the sheet-like connector 11 of this embodiment, positioning holes (not illustrated) are respectively formed at positions of four corners of the insulating sheet 12.

As a material for forming the insulating sheet 12, may be used a glass fiber-reinforced epoxy resin, glass fiber-reinforced polyimide resin, glass fiber-reinforced bismaleimide triazine resin, polyimide resin or the like.

The thickness of the insulating sheet 12 is, for example, 50 to 500 µm.

As a material for forming the electrode structures 13, may be used nickel, copper, silver, palladium, iron or the like. The electrode structures 13 may be those formed of a simple metal as a whole, those formed of an alloy of at least two metals or those obtained by laminating at least two metals. The surfaces of the front-surface electrode part 14 and back-surface electrode part 15 in each of the electrode structures 13 are preferably formed by a chemically stable metal having high conductivity, such as gold, silver or palladium in that oxidation of the electrode parts is prevented, and electrode parts small in contact resistance are obtained.

The first anisotropically conductive sheet 20 is composed of a plurality of columnar conductive path-forming parts 21 each extending in a thickness-wise direction thereof and an insulating part 22 mutually insulating these conductive path-forming parts 21, and the respective conductive path-forming parts 21 are arranged in accordance with a pattern corresponding to a pattern of the electrode structures 13 in sheet-like connector 11.

The first anisotropically conductive sheet 20 is formed by an insulating elastic polymeric substance as a whole, and conductive particles P are contained in the conductive path-forming parts 21 thereof in a state oriented so as to align in the thickness-wise direction. On the other hand, the conductive particles are not present at all or scarcely present in the insulating part 22.

In the first anisotropically conductive sheet 20 of this embodiment, one surface (upper surface in FIG. 1) coming into contact with the circuit device, which is the object of inspection, is made flat. On the other hand, projected portions protruding from the surface of the insulating part 22 are formed at the surfaces of the conductive path-forming parts 21 on the other surface coming into contact with the sheet-like connector 11.

The first anisotropically conductive sheet 20 is arranged or the front surface of the sheet-like connector 11 in such a manner that the conductive path-forming parts 21 are located on the front-surface electrode parts 14 of their corresponding electrode structures 13.

A plate-like support 23 for supporting the peripheral edge portion of the first anisotropically conductive sheet 20 is provided at the peripheral edge portion of the first anisotropically conductive sheet 20. More specifically, the support 23 has a rectangular opening 23K formed at a central position thereof and having a size smaller than the first anisotropically conductive sheet 20 and moreover has positioning holes (not illustrated) respectively formed at positions of four corners thereof, and the first anisotropically conductive sheet 20 is arranged in the opening 23K of the support 23. The first anisotropically conductive sheet 20 is supported by the support 23 by fixing the peripheral edge portion of the first anisotropically conductive sheet 20 to the support 23.

In the first anisotropically conductive sheet 20, the diameter of the conductive path-forming parts 21 is preset according to the diameter and pitch of the electrodes to be inspected of the circuit device that is the object of inspection. More specifically, the diameter of the conductive path-forming parts 21 is preferably 0.7 to 1.3 times as much as the diameter of the electrodes to be inspected of the circuit device that is the object of inspection, particularly preferably 0.8 to 1.2 times, and is preferably 0.3 to 1.2 times as much as the pitch of the electrodes to be inspected of the circuit device that is the object of inspection, particularly preferably 0.4 to 1 time.

If the diameter of the conductive path-forming parts 21 is too small, the conductivity of such conductive path-forming parts 21 may become low in some cases. If the diameter of the conductive path-forming parts 21 is too great on the other hand, it may be difficult in some cases to secure necessary insulating property between adjoining conductive path-forming parts 21.

The thickness of the conductive path-forming parts 21 in the first anisotropically conductive sheet 20 is suitably preset in consideration of the projected height of electrodes (electrodes to be inspected of the circuit device in this embodiment) to be connected, the diameter of the conductive path-forming parts 21, etc. However, the thickness is preferably 0.2 to 1.2 mm, more preferably 0.3 to 1 mm.

A ratio of the thickness of the conductive path-forming parts 21 to the diameter of the conductive path-forming parts 21 is preferably 0.3 to 1.5, more preferably 0.5 to 1.2.

The second anisotropically conductive sheet 25 is composed of a plurality of columnar conductive path-forming parts 26 each extending in a thickness-wise direction thereof and an insulating part 27 mutually insulating these conductive path-forming parts 26, and the respective conductive path-forming parts 26 are arranged in accordance with a pattern corresponding to a pattern of the electrode structures 13 in the sheet-like connector 11.

The second anisotropically conductive sheet 25 is formed by an insulating elastic polymeric substance as a whole, and conductive particles P are contained in the conductive path-forming parts 26 thereof in a state oriented so as to align in the thickness-wise direction. On the other hand, the conductive particles are not present at all or scarcely present in the insulating part 27.

In the second anisotropically conductive sheet 25 of this embodiment, projected portions protruding from the surface of the insulating part 27 are formed at the surfaces of the conductive path-forming parts 26 on both surfaces thereof.

The second anisotropically conductive sheet 25 is arranged on the back surface of the sheet-like connector 11 in such a manner that the conductive path-forming parts 26 are located on the back-surface electrode parts 15 of their corresponding electrode structures 13.

A plate-like support 28 for supporting the peripheral edge portion of the second anisotropically conductive sheet 25 is provided at the peripheral edge portion of the second anisotropically conductive sheet 25. More specifically, the support 28 has a rectangular opening 28K formed at a central position thereof and having a size smaller than the second anisotropically conductive sheet 25 and moreover has positioning holes (not illustrated) respectively formed at positions of four corners thereof, and the second anisotropically conductive sheet 25 is arranged in the opening 28K of the support 28. The second anisotropically conductive sheet 25 is supported by the support 28 by fixing the peripheral edge portion of the second anisotropically conductive sheet 25 to the support 28.

The thickness of the conductive path-forming parts 26 in the second anisotropically conductive sheet 25 is suitably preset in consideration of the diameter of the conductive path-forming parts 26, etc. However, the thickness is preferably 0.05 to 0.6 mm, more preferably 0.1 to 0.4 mm.

A ratio of the thickness of the conductive path-forming parts 26 to the diameter of the conductive path-forming parts 26 is preferably 0.3 to 1.5, more preferably 0.5 to 1.2.

As the elastic polymeric substances forming the first anisotropically conductive sheet 20 and second anisotropically conducive sheet 25, are preferred polymeric substances having a crosslinked structure. As curable polymeric substance-forming materials usable for obtaining such elastic polymeric substances, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene terpolymer rubber.

When weather resistance is required of the resulting first anisotropically conductive sheet 20 and second anisotropically conductive sheet 25, other materials than conjugated diene rubbers among the above-described materials are preferably used. In particular, silicone rubber is preferably used from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 because an anisotropically conductive sheet good in heat resistance is obtained.

As the conductive particles P contained in the conductive path-forming parts 21 in the first anisotropically conductive sheet 20 and the conductive path-forming parts 26 in the second anisotropically conductive sheet 25, conductive particles exhibiting magnetism are preferably used in that such particles can be easily oriented by a process, which will be described subsequently. Specific examples of such conductive particles include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on the means for coating the surfaces of the core particles with the conductive metal. However, for example, a chemical plating, electroplating, sputtering or vapor deposition process is used.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The particle diameter of the conductive particles P is preferably 1 to 100 μm, more preferably 2 to 50 μm, still more preferably 3 to 30 μm, particularly preferably 4 to 20 μm.

The particle diameter distribution (Dw/Dn) of the conductive particles P is preferably 1 to 10, more preferably 1.01 to 7, still more preferably 1.05 to 5, particularly preferably 1.1 to 4.

When conductive particles satisfying such conditions are used, the resulting conductive path-forming parts become easy to deform under pressure, and sufficient electrical contact is achieved among the conductive particles in the conductive path-forming parts.

No particular limitation is imposed on the form of the conductive particles P. However, they are preferably in the form of a sphere or star, or secondary particles obtained by aggregating these particles from the viewpoint of permitting easy dispersion of these particles in the polymeric substance-forming material.

Those obtained by treating surfaces of the conductive particles P with a coupling agent such as a silane coupling agent, or a lubricant may be suitably used. By treating the surfaces of the particles with the coupling agent or lubricant, the durability of the resulting anisotropically conductive sheet is improved.

Such conductive particles P are preferably used in a proportion of 5 to 60%, more preferably 7 to 50% in terms of volume fraction to the polymeric substance-forming material. If this proportion is lower than 5%, conductive path-forming parts sufficiently low in electric resistance value may not be obtained in some cases. If the proportion exceeds 60% on the other hand, the resulting conductive path-forming parts are liable to be brittle, so that elasticity required of the conductive path-forming parts may not be achieved in some cases.

As the conductive particles P, are preferred those having surfaces coated with gold. When the target electrodes to be connected, for example, electrodes to be inspected in a circuit device, which is an object of inspection, are composed of a solder containing lead, however, conductive particles contained in surface layer portions in the first anisotropically conductive sheet 20 coming into contact with the electrodes to be inspected, which are composed of the solder, are preferably coated with a diffusion-resistant metal selected from rhodium, palladium, ruthenium, tungsten, molybdenum, platinum, iridium, silver and alloys thereof, whereby diffusion of the lead component into the coating layer of the conductive particles can be prevented.

The conductive particles having surfaces coated with the diffusion-resistant metal can be formed by coating the surfaces of core particles composed of, for example, nickel, iron, cobalt or an alloy thereof, with the diffusion-resistant metal by, for example, a chemical plating, electroplating, sputtering or vapor deposition process.

The coating amount of the diffusion-resistant metal is preferably in a proportion of 5 to 40%, more preferably 10 to 30% in terms of mass fraction to the conductive particles.

The surface layer portions in the first anisotropically conductive sheet 20, which come into contact with the circuit device, may also contain particles (hereinafter referred to as "non-magnetic insulating particles") exhibiting neither magnetism nor conductivity. As the non-magnetic insulating particles, may be used diamond powder, glass powder, ceramic powder, ordinary silica powder, colloidal silica, aerogel silica, alumina or the like. Among these, diamond powder is preferred.

When such non-magnetic insulating particles are contained in the surface layer portions in the first anisotropically conductive sheet 20, which come into contact with the circuit device, the hardness of said surface layer portions becomes high, and so high repetitive durability can be achieved, and when the electrodes to be inspected contain lead, the migration of the lead component into the coating layers of the conductive particles can be prevented, whereby still more stable conductivity is attained over a long period of time, and moreover adhesion of the circuit device, which is the object of inspection, to the first anisotropically conductive sheet 20 can be inhibited.

The particle diameter of the non-magnetic insulating particles is preferably 0.1 to 50 µm, more preferably 0.5 to 40 µm, still more preferably 1 to 30 µm. If the particle diameter is too small, it is difficult to sufficiently impart the effect of inhibiting permanent deformation and deformation by abrasion to the resulting anisotropically conductive sheet. When non-magnetic insulating particles having a too small particle diameter are used in a great amount, the flowability of the molding material for obtaining the first anisotropically conductive sheet 20 is deteriorated, so that it may be difficult in some cases to orient the conductive particles in such a molding material by a magnetic field.

If the particle diameter is too great on the other hand, it may be difficult in some cases to obtain conductive path-forming parts 21 low in electric resistance value due to presence of such non-magnetic insulating particles in the conductive path-forming parts 21.

No particular limitation is imposed on the amount of the non-magnetic insulating particles used. If the amount of the non-magnetic insulating particles used is small, however, the hardness of the surface layer portions in the resulting first anisotropically conductive sheet 20 cannot be increased. If the amount of the non-magnetic insulating particles used is great, it is impossible to sufficiently achieve the orientation of the conductive particles by a magnetic field in a production process, which will be described subsequently. It is hence not preferable to use the non-magnetic insulating particles in such a small or great amount The practical amount of the non-magnetic insulating particles used is 5 to 90 parts by weight per 100 parts by weight of the elastic polymeric substance forming the surface layer portions in the first anisotropically conductive sheet 20.

As a material forming the support 23 provided in the first anisotropically conductive sheet 20 and the support 28 provided in the second anisotropically conductive sheet 25, is preferably used that having a coefficient of linear thermal expansion of at most $3\times10^{-5}$/K, more preferably $2\times10^{-5}$ down to $1\times10^{-6}$/K, particularly preferably $6\times10^{-6}$ down to $1\times10^{-6}$/K.

As a specific material, a metallic material or non-metallic material is used.

As the metallic material, may be used gold, silver, copper, iron, nickel, cobalt or an alloy thereof.

As the non-metallic material, may be used a resin material having high mechanical strength, such as a polyimide resin, polyester resin, fluorocarbon resin, polyaramide resin or polyamide resin, a composite resin material such as a glass fiber-reinforced epoxy resin, glass fiber-reinforced polyester resin or glass fiber-reinforced polyimide resin, or another composite resin material with an inorganic material such as silica, alumina or boron nitride mixed as a filler into an epoxy resin or the like. Among these, the polyimide resin, the composite resin material such as the glass fiber-reinforced epoxy resin, or the composite resin material such as an epoxy resin with boron nitride mixed as a filler therein is preferred in that it is low in coefficient of thermal expansion.

In the above-described anisotropically conductive connector device 10, the conductive path-forming parts 26 in the second anisotropically conductive sheet 25 each have a diameter smaller than the diameter of the conductive path-forming parts 21 in the first anisotropically conductive sheet 20. More specifically, a ratio of the diameter of each conductive path-forming part 26 in the second anisotropically conductive sheet 25 to the diameter of each conductive path-forming part 21 in the first anisotropically conductive sheet 20 is preferably 0.3 to 0.9, more preferably 0.4 to 0.8.

If this ratio is too low, the conductivity of the conductive path-forming parts 26 may become low in some cases. If this ratio is too high on the other hand, such a conductive path-forming part 26 may be easy to short-circuit to inspection electrodes adjoining an inspection electrode electrically connected to this conductive path-forming part.

The diameter of the front-surface electrode parts 14 in the electrode structures 13 in the sheet-like connector 11 may be any size so far as the front-surface electrode parts 14 of adjoining electrode structures 13 do not come into contact with each other. For the purpose of effectively utilizing a conductive path formed in each conductive path-forming part 21 in the first anisotropically conductive sheet 20, however, the diameter is preferably at least 0.8 time as much as the diameter of the conductive path-forming part 21, particularly preferably 0.9 to 1.2 times.

If the diameter of the front-surface electrode part 14 is too small, the conductive path formed in the conductive path-forming part 21 is not effectively utilized, and so the conductivity of the conductive path-forming part 21 may be lowered in some cases.

The sheet-like connector 11 can be produced, for example, in the following manner.

Figure 2:
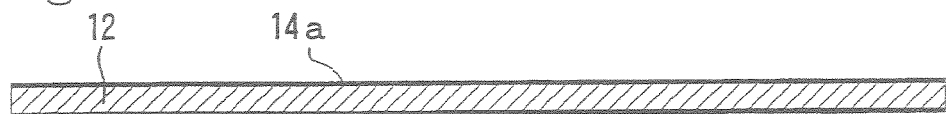
[FIG. 2] is a cross-sectional view illustrating the construction of a laminate material for obtaining a sheet-like connector.

A laminate material with metal layers 14a and 15a formed on both surfaces of an insulating sheet 12 is first provided as illustrated in FIG. 2.

Figure 3:
[FIG. 3] is a cross-sectional view illustrating a state that through-holes have been formed in the laminate material shown in FIG. 2.

A plurality of through-holes 16H are then formed in the laminate material in accordance with a pattern of electrode structures 13 to be formed as illustrated in FIG. 3. As a method for forming the through-holes 16H in the laminate material, may be used drill machining, laser beam machining or the like.

Figure 4:
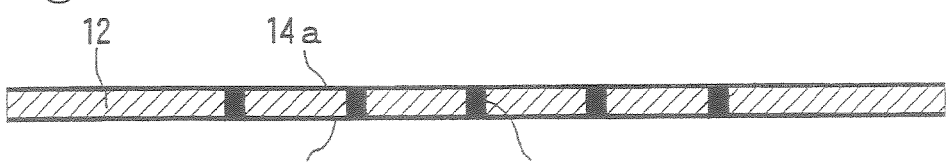
[FIG. 4] is a cross-sectional view illustrating a state that short circuit parts have been formed in the laminate material.

The interiors of the respective through-holes 16H formed in the laminate material are then subjected to a plating treatment, thereby forming short circuit parts 16 connected to the metal layer 14a and the metal layer 15a and extending through in a thickness-wise direction of the insulating sheet 12 as illustrated in FIG. 4.

Figure 5:
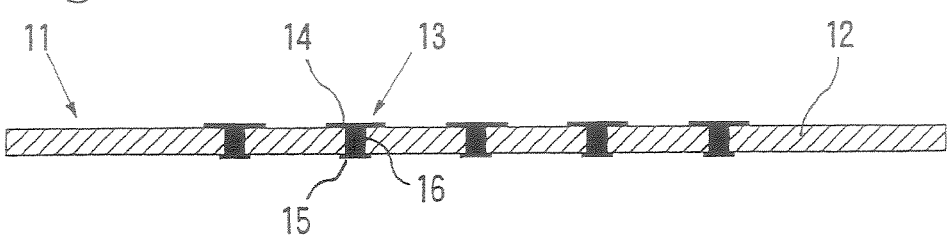
[FIG. 5] is a cross-sectional view illustrating the construction of a sheet-like connector.

The metal layer 14a and the metal layer 15a are then subjected to photolithography and an etching treatment to remove a part thereof, thereby forming electrode structures 13, in each of which a front-surface electrode part 14 exposed to a front surface of the insulating sheet 12 and a back-surface electrode part 15 exposed to a back surface of the insulating sheet 12 are integrally connected to each other through the short circuit part 16 as illustrated in FIG. 5, thus producing the sheet-like connector 11.

The first anisotropically conductive sheet 20 can be produced, for example, in the following manner.

Figure 6:
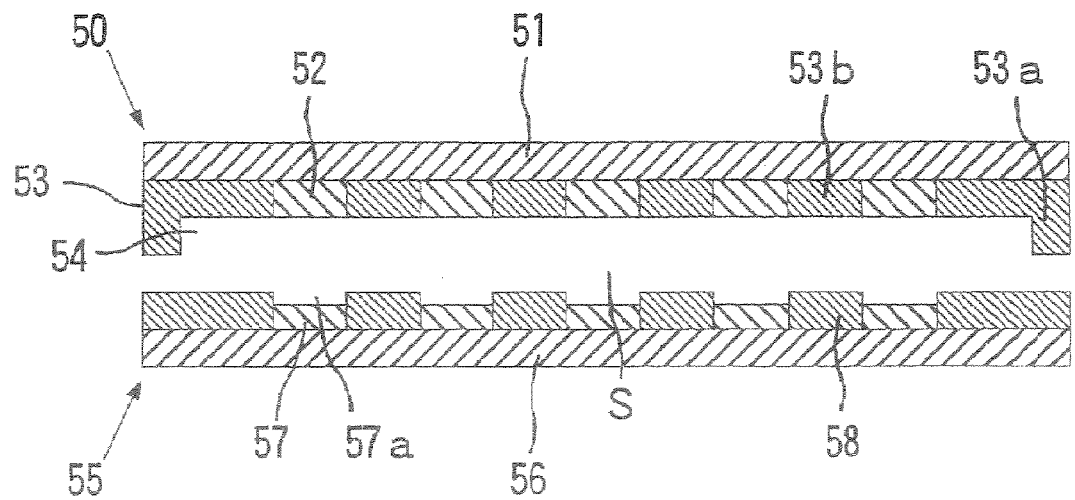
[FIG. 6] is a cross-sectional view illustrating the construction of an exemplary mold for producing the first anisotropically conductive sheet.

FIG. 6 is a cross-sectional view illustrating the construction of an exemplary mold used for producing the first anisotropically conductive sheet 20. This mold is so constructed that a top force 50 and a bottom force 55 making a pair therewith are arranged so as to be opposed to each other. A molding cavity S is defined between a molding surface (lower surface in FIG. 6) of the top force 50 and a molding surface (upper surface in FIG. 6) of the bottom force 55.

In the top force 50, ferromagnetic substance layers 52 are formed in accordance with an arrangement pattern corresponding to a pattern of the conductive path-forming parts 21 in the intended first anisotropically conductive sheet 20 on a surface (lower surface in FIG. 6) of a ferromagnetic substance substrate 51, and non-magnetic substance layers 53 composed of portions 53b (hereinafter referred to as "portions 53b" merely) having substantially the same thickness as the thickness of the ferromagnetic substance layers 52 and portions 53a (hereinafter referred to as "portions 53a" merely) having a thickness greater than the thickness of the ferromagnetic substance layers 52 are formed at other places than the ferromagnetic substance layers 52. A difference in level is defined between the portions 53a and the portion 53b in the non-magnetic substance layers 53, whereby a recess 54 is formed in the surface of the top force 50.

In the bottom force 55 on the other hand, ferromagnetic substance layers 57 are formed in accordance with a pattern corresponding to the pattern of the conductive path-forming parts 21 in the intended first anisotropically conductive sheet 20 on a surface (upper surface in FIG. 6) of a ferromagnetic substance substrate 56, and non-magnetic substance layers 58 having a thickness greater than the thickness of the ferromagnetic substance layers 57 are formed at other places than the ferromagnetic substance layers 57. A difference in level is defined between the non-magnetic substance layers 58 and the ferromagnetic substance layers 57, whereby recessed portions 57a for forming projected portions in the intended first anisotropically conductive sheet 20 are formed in the molding surface of the bottom force 55.

As a material for forming the respective ferromagnetic substance substrates 51 and 56 in the top force 50 and bottom force 55, may be used a ferromagnetic metal such as iron, iron-nickel alloy, iron-cobalt alloy, nickel or cobalt. The ferromagnetic substance substrates 51 and 56 preferably each have a thickness of 0.1 to 50 mm, and are preferably smooth at surfaces thereof and subjected to a chemical degreasing treatment or mechanical polishing treatment.

As a material for forming the ferromagnetic substance layers 52 and 57 in both top force 50 and bottom force 55, may be used a ferromagnetic metal such as iron, iron-nickel alloy, iron-cobalt alloy, nickel or cobalt. The ferromagnetic substance layers 52 and 57 preferably each have a thickness of at least 10 μm. If this thickness is smaller than 10 μm, it is difficult to apply a magnetic field having sufficient intensity distribution to a molding material layer formed within the mold. As a result, it is difficult to gather the conductive particles at a high density at portions to become conductive path-forming parts in the molding material layer, and so a good anisotropically conductive sheet may not be provided in some cases.

As a material for forming the non-magnetic substance layers 53 and 58 in both top force 50 and bottom force 55, may be used a non-magnetic metal such as copper, a polymeric substance having heat resistance, or the like. However, a polymeric substance cured by radiation is preferably used in that the non-magnetic substance layers 53 and 58 can be easily formed by a technique of photolithography. As a material thereof may be used, for example, a photoresist such as an acrylic type dry film resist, epoxy type liquid resist or polyimide type liquid resist.

The thickness of the non-magnetic substance layers 58 in the bottom force 55 is preset according to the projected height of the projected portions in the first anisotropically conductive sheet 20 to be formed and the thickness of the ferromagnetic substance layers 57.

The above-described mold is used to produce the first anisotropically conductive sheet 20, for example, in the following manner.

Figure 7:
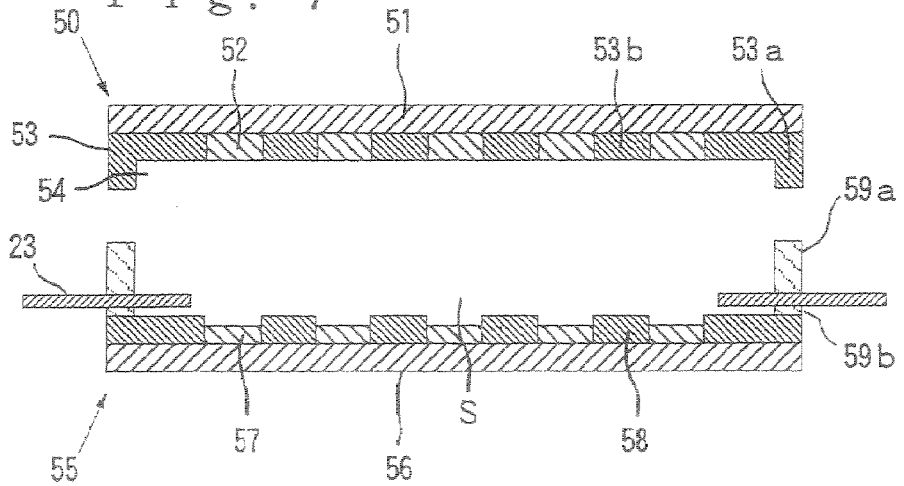
[FIG. 7] is a cross-sectional view illustrating a state that a spacer and a support have been arranged on the molding surface of a bottom force.

As illustrated in FIG. 7, frame-like spacers 59a and 59b and a support 23 are first provided, and the support 23 is fixed and arranged at a predetermined position of the bottom force 55 through the frame-like spacer 59b. Further, the frame-like spacer 59a is arranged on the support 23.

On the other hand, conductive particles exhibiting magnetism are dispersed in a liquid polymeric substance-forming material, which will become an elastic polymeric substance by being cured, thereby preparing a molding material for obtaining the first anisotropically conductive sheet 20.

Figure 8:
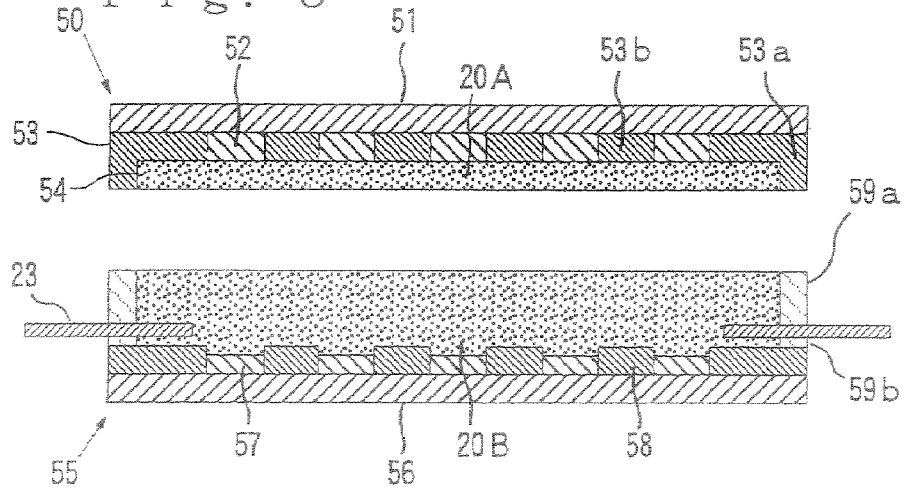
[FIG. 8] is a cross-sectional view illustrating a state that a first molding material layer has been formed on the molding surface of a top force, and a second molding material layer has been formed on the molding surface of the bottom force.

As illustrated in FIG. 8, the molding material is then charged into the recess 54 on the molding surface of the top force 50 to form a first molding material layer 20A. On the other hand, the molding material is charged into a cavity defined by the bottom force 55, the spacers 59a and 59b, and the support 23 to form a second molding material layer 20B.

Figure 9:
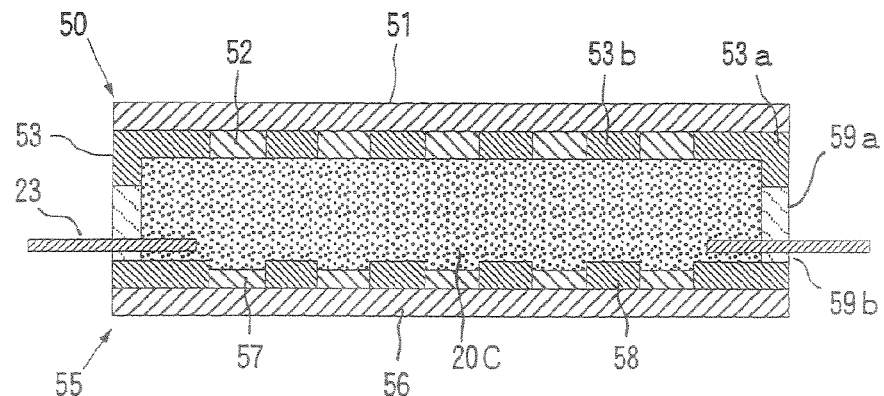
[FIG. 9] is a cross-sectional view illustrating a state that a molding material layer of a form conforming to the intended first anisotropically conductive sheet has been formed.

The top force 50 is then arranged in alignment on the spacer 59a, whereby the first molding material layer 20A is stacked on the second molding material layer 20B, thereby forming a molding material layer 20C of a form conforming to the intended first anisotropically conductive sheet 20 as illustrated in FIG. 9.

Figure 10:
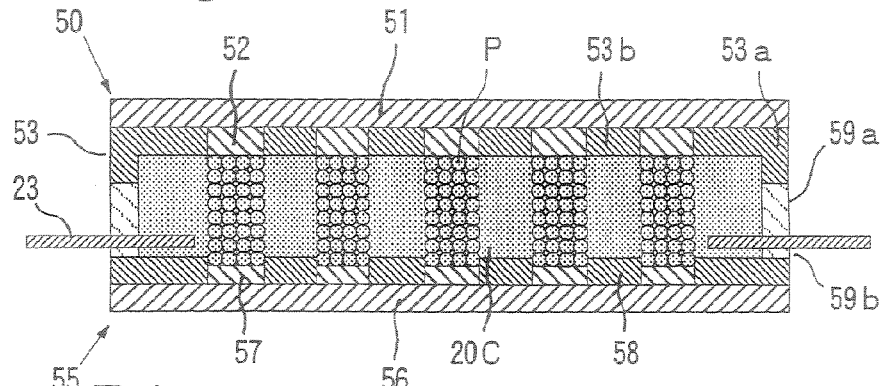
[FIG. 10] is a cross-sectional view illustrating a state that conductive particles in the molding material layer have been gathered at portions, which will become conductive path-forming parts.

Electromagnets (not illustrated) arranged on the upper surface of the ferromagnetic substance substrate 51 in the top force 50 and on the lower surface of the ferromagnetic substance substrate 56 in the bottom force 55 are operated, whereby a parallel magnetic field having a strength distribution, i.e., a parallel magnetic field having higher intensity at portions between the ferromagnetic substance layers 52 of the top force 50 and their corresponding ferromagnetic substance layers 57 of the bottom force 55, is applied to the molding material layer 20C in a thickness-wise direction thereof. As a result, in the molding material layer 20C, the conductive particles P dispersed in the molding material layer 20C are gathered at portions to become the conductive path-forming parts 21 located between the respective ferromagnetic substance layers 52 of the top force 50 and their corresponding ferromagnetic substance layers 57 of the bottom force 55, and oriented so as to align in a thickness-wise directions of the molding material layer as illustrated in FIG. 10.

Figure 11:
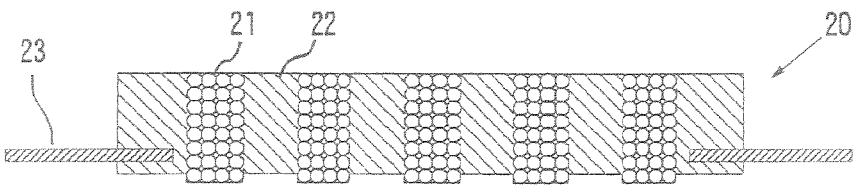
[FIG. 11] is a cross-sectional view illustrating the construction of the first anisotropically conductive sheet.

In this state, the molding material layer 20C is subjected to a curing treatment, whereby the first anisotropically conductive sheet 20 composed of the conductive path-forming parts 21, in which the conductive particles P are densely charged in the elastic polymeric substance in a state oriented so as to align in the thickness-wise direction, and the insulating part 22 formed so as to surround the conductive path-forming parts 21 and composed of the insulating elastic polymeric substance, in which the conductive particles P are not present at all or scarcely present, is produced in a state supported by the support 23 as illustrated in FIG. 11.

In the above-described process, the curing treatment of the molding material layer 20C may be conducted in a state that the parallel magnetic field has been applied as it is, or may also be conducted after the application of the parallel magnetic field has been stopped.

The intensity of the parallel magnetic field applied to the molding material layer 20C is preferably an intensity that it amounts to 20,000 to 1,000,000 µT on the average.

As a means for applying the parallel magnetic field to the polymeric material layer 20C, permanent magnets may also be used in place of the electromagnets. As the permanent magnets, are preferred those composed of alunico (Fe—Al—Ni—Co alloy), ferrite or the like in that the intensity of a parallel magnetic field within the above range is achieved.

The curing treatment of the molding material layer 20C is suitably selected according to the material used. However, the treatment is generally conducted by a heat treatment. Specific heating temperature and heating time are suitably selected in view of the kinds of the polymeric substance-forming material making up the molding material layer, and the like, the time required for movement of the conductive particles, etc.

The second anisotropically conductive sheet 25 can be produced in accordance with the above-described production process of the first anisotropically conductive sheet 20.

In the anisotropically conductive connector device 10 described above, in the electrical inspection of a circuit device, which is an object of inspection, the first anisotropically conductive sheet 20 is arranged between the circuit device which is an object of inspection and the circuit board for inspection so as to come into contact with the circuit device that is the object of inspection.

Since the circuit board for inspection does not come into contact with the first anisotropically conductive sheet 20 in this state, conductive path-forming parts 21 each having a diameter sufficiently large according to the diameter of the electrodes to be inspected can be formed in the first anisotropically conductive sheet 20 irrespective of the form of the inspection electrodes in the circuit board for inspection and the size of a clearance between inspection electrodes adjoining each other, whereby the conductive path-forming parts 21 in the first anisotropically conductive sheet 20 can secure a sufficiently large thickness without impairing necessary conductivity, and so even a wide scatter of projected height in the electrodes to be inspected can be fully absorbed by elastic deformation of the conductive path-forming parts 21. As a result, the electrical connection of the conductive path-forming parts 21 to the electrodes to be inspected can be surely achieved.

Since the second anisotropically conductive sheet 25 has the conductive path-forming parts 26 having a diameter smaller than the diameter of the conductive path-forming parts 21 in the first anisotropically conductive sheet 20, the electrical connection of the conductive path-forming parts 26 to the inspection electrodes to be connected can be surely achieved without short-circuiting to adjoining electrodes to be inspected even when the inspection electrodes each have a special form, and a clearance between adjoining electrodes to be inspected is small. In addition, the circuit device, which is the object of inspection, does not come into contact with the second anisotropically conductive sheet 25, whereby the thickness of the conductive path-forming parts 26 in the second anisotropically conductive sheet 25 may be small irrespective of the scatter of the projected height of the electrodes to be inspected in the circuit device, so that conductive path-forming parts 26 having necessary conductivity can be obtained.

Accordingly, according to the above-described anisotropically conductive connector device, necessary electrical connection can be surely achieved in electrical inspection of a circuit device even when electrodes to be inspected of the circuit device, which is an object of inspection, are those projected, the circuit board for inspection has inspection electrodes each having a special form, and a clearance between inspection electrodes adjoining each other is small, and moreover necessary conductivity can be attained.

Figure 12:
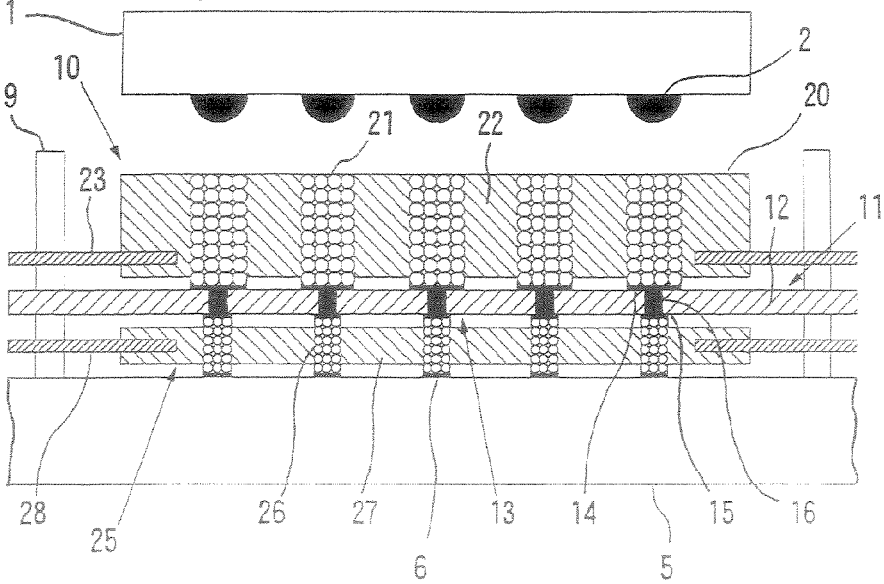
[FIG. 12] illustrates the construction of an exemplary inspection apparatus for circuit devices according to the present invention together with a circuit device.

FIG. 12 schematically illustrates the construction of an exemplary inspection apparatus for circuit devices according to the present invention.

This inspection apparatus for circuit devices is provided with a circuit board 5 for inspection having guide pins 9. On a front surface (upper surface in FIG. 12) of this circuit board 5 for inspection, inspection electrodes 6 are formed in accordance with a pattern corresponding to a pattern of semispherical solder ball electrodes 2, which are electrodes to be inspected in a circuit device 1 that is an object of inspection.

On the front surface of the circuit board 5 for inspection, is arranged the anisotropically conductive connector device 10 of the construction illustrated in FIG. 1. More specifically, the guide pins 9 are inserted into positioning holes (not illustrated) respectively formed in the support 23 provided in the first anisotropically conductive sheet 20, the sheet-like connector 11 and the support 28 provided in the second anisotropically conductive sheet 25, whereby the anisotropically conductive connector device 10 is fixed on to the front surface of the circuit board 5 for inspection in a state that the conductive path-forming parts 26 in the second anisotropically conductive sheet 25 have been positioned so as to be located on the inspection electrodes 6.

Figure 13:
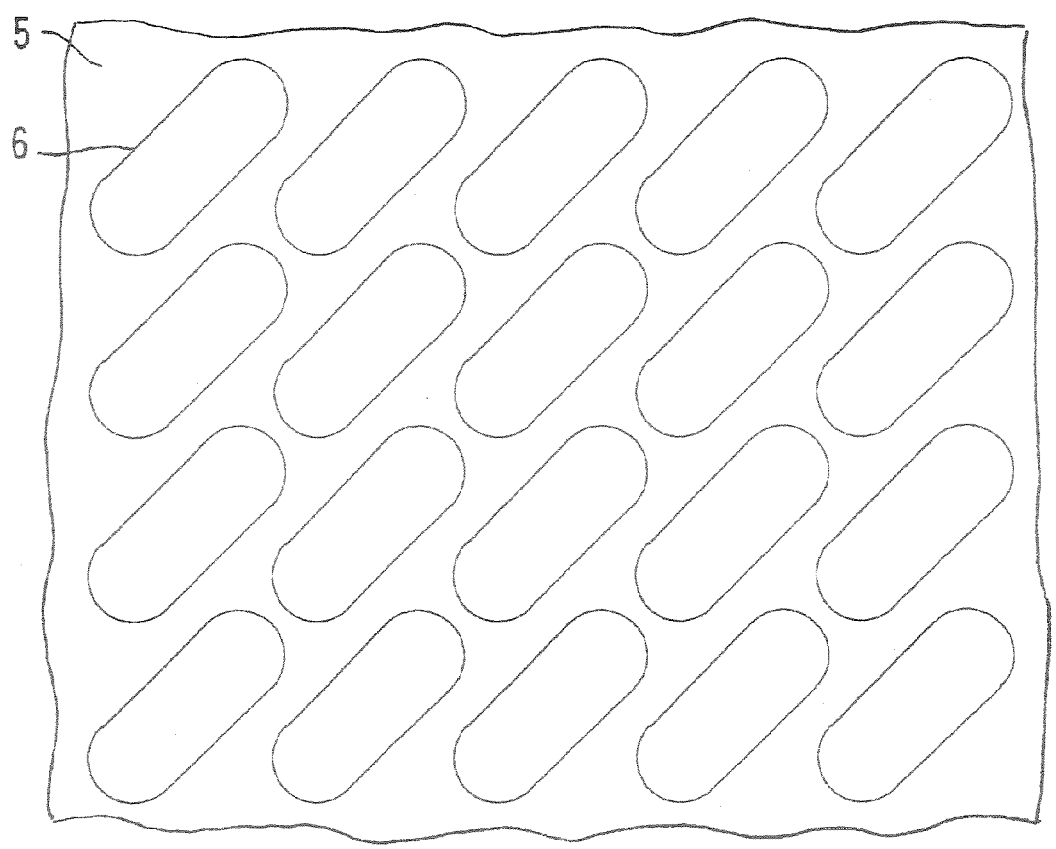
[FIG 13] illustrates a pattern of inspection electrodes in a circuit board for inspection.

In this inspection apparatus for circuit devices, a probe member, in which pin probes are arranged corresponding to the solder ball electrodes 2, may be used in place of the anisotropically conductive connector device 10. Therefore, the inspection electrodes 6 in the circuit board 5 for inspection each have a cocoon-shaped form and are arranged in accordance with a pattern corresponding to a pattern of the electrodes 2 to be inspected in a state inclined at an angle of, for example 45° as illustrated in FIG. 13.

In such an inspection apparatus for circuit devices, the circuit device 1 is arranged on the anisotropically conductive connector device 10 in such a manner that the solder ball electrodes 2 are located on the conductive path-forming parts 21 in the first anisotropically conductive sheet 20. In this state, for example, the circuit device 1 is pressed in a direction approaching the circuit board 5 for inspection, whereby each of the conductive path-forming parts 21 in the first anisotropically conductive sheet 20 and the conductive path-forming parts 26 in the second anisotropically conductive sheet 25 is in a sate held under pressure. As a result, electrical connection between each of the solder ball electrodes 2 in the circuit device 1 and each of the inspection electrodes 6 of the circuit board 5 or inspection is achieved through the conductive path-forming part 21 in the first anisotropically conductive sheet 20, the electrode structure 13 of the sheet-like connector 11 and the conductive path-forming part 26 in the second anisotropically conductive sheet 25. In this state, the inspection of the circuit device 1 is conducted.

According to the above-described inspection apparatus for circuit devices, necessary electrical connection can be surely achieved even when the electrodes to be inspected of the circuit device, which is an object of inspection, are solder ball electrodes 2, the circuit board 5 for inspection has inspection electrodes 6 each having a special form, and a clearance between inspection electrodes adjoining each other is small because the above-described anisotropically conductive connector device 10 is arranged on the circuit board 5 for inspection. In addition, necessary conductivity can be attained between the electrodes to be inspected and the inspection electrodes.

The present invention is not limited to the above-described embodiment, and various changes or modifications may be added thereto.

(1) When the anisotropically conductive connector device according to the present invention is used in inspection of circuit devices, the electrodes to be inspected of a circuit device, which is an object of inspection are not limited to the semispherical solder ball electrodes and they may be, for example, lead electrodes or flat plate electrodes.

(2) It is not essential to provide the support in the first anisotropically conductive sheet and second anisotropically conductive sheet.

(3) The first anisotropically conductive sheet may be either that, both surfaces of which are flat, or that in which projected portions protruding from the surface of the insulating part are formed at the surfaces of the conductive path-forming parts on both surfaces thereof.

(4) The second anisotropically conductive sheet may be either that, both surfaces of which are flat, or that in which projected portions protruding from the surface of the insulating part are formed at the surfaces of the conductive path-forming parts on one surface or the other surface thereof.

(5) Any one or both of the first anisotropically conductive sheet and second anisotropically conductive sheet may be integrally bonded to the sheet-like connector.

Such an anisotropically conductive connector device can be produced by using a mold having a connector-arranging space region capable of arranging a sheet-like connector within a molding cavity as a mold for producing the first anisotropically conductive sheet or second anisotropically conductive sheet, arranging the sheet-like connector in the connector-arranging space region within the molding cavity of the mold, charging a molding material into, for example, the molding cavity in this state and subjecting the molding material to a curing treatment.

(6) In the inspection apparatus for circuit devices, a sheet-like connector, in which a plurality of electrode structures each extending through 1n a thickness-wise direction of the connector, may be further arranged on the surface on the side of the circuit device to be inspected in the first anisotropically conductive sheet to electrically connect the electrodes to be inspected of the circuit device to be inspected to the conductive path-forming parts of the first anisotropically conductive sheet through the electrode structures of the sheet-like connector. In such construction, the sheet-like connector may be provided integrally with the first anisotropically conductive sheet.

The invention claimed is:

1. An anisotropically conductive connector device comprising a first anisotropically conductive sheet and a second anisotropically conductive sheet, in which a plurality of conductive path-forming parts each extending in a thickness-wise direction of each sheet are arranged in a state mutually insulated by an insulating part wherein the conductive path-forming parts in the second anisotopically conductive sheet each have a diameter smaller than a diameter of each of the conductive path-forming parts in the first anisotropically conductive sheet, wherein a sheet connector composed of an insulating sheet and a plurality of electrode structures, each structure extending through in a thickness-wise direction of the insulating sheet, the insulating sheet provided between the anisotropically conductive sheets for electrically connecting the first anisotropically conductive sheet to the second anisotropically conductive sheet; wherein in each of the electrode structures in the sheet connector, a front-surface electrode part exposed to the front surface of the insulating sheet and a back-surface electrode part exposed to the back surface of the insulating sheet are connected to each other through a short circuit part extending through in the thickness-wise direction of the insulating sheet.

2. The anisotropically conductive connector device according to claim 1 , wherein the first anisotropically conductive sheet and the second anisotropically conductive sheet are each formed by an elastic polymeric substance as a whole, and conductive particles exhibiting magnetism are contained in the conductive path-forming parts thereof.

3. The anisotropically conductive connector device according to claim 1, wherein a ratio of the diameter of each conductive path-forming part in the second anisotropically conductive sheet to the diameter of each conductive path-forming part in the first anisotropically conductive sheet is 0.3 to 0.9.

4. The anisotropically conductive connector device according to claim 1, wherein a support for supporting the peripheral edge portion of each of the first anisotropically conducive sheet and second anisotropically conductive sheet is provided at the peripheral edge portion.

5. The anisotropically conductive connector device according to claim 1, which is an anisotropically conductive connector device for conducting electrical connection between electrodes to be inspected of a circuit device, which is an object of inspection, and inspection electrodes of a circuit board for inspection by intervening between the circuit device and the circuit board for inspection, and wherein the first anisotropically conductive sheet is brought into contact with the circuit device which is an object of inspection.

6. An inspection apparatus for circuit boards, comprising:
a circuit device for inspection having inspection electrodes arranged corresponding to electrodes to be inspected of a circuit device, which is an object of inspection, and
the anisotropically conductive connector device according to claim 5, which is arranged on the circuit board for inspection.

7. An anisotropically conductive connector device comprising a sheet-like connector composed of an insulating sheet and a plurality of electrode structures each extending through in a thickness-wise direction of the insulating sheet, a first anisotropically conductive sheet provided on the front surface of the sheet-like connector and a second anisotropically conductive sheet provided on the front surface of the sheet-like connector, wherein in each of the electrode structures in the sheet-like connector, a front-surface electrode part exposed to the front surface of the insulating sheet and a back-surface electrode part exposed to the back surface of the insulating sheet are connected to each other through a short circuit part extending through in the thickness-wise direction of the insulating sheet, the first anisotropically conductive sheet is composed of a plurality of conductive path-forming parts, which are arranged in accordance with a pattern corresponding to the electrode structures in the sheet-like connector and extend in a thickness-wise direction of the anisotropically conductive sheet, and an insulating part mutually insulating these conductive path-forming parts, and is arranged in such a manner that the conductive path-forming parts are respectively located on the front-surface electrode parts of heir corresponding electrode structures, the second anisotropically conductive sheet is composed of a plurality of conductive path-forming parts, which are arranged in accordance with a pattern corresponding to the electrode structures in the sheet-like connector and each extend in a thickness-wise direction of the anisotropically conductive sheet, and an insulating part mutually insulating these conductive path-forming parts, and is arranged in such a manner that the conductive path-forming parts are respectively located on the back-surface electrode parts of their corresponding electrode structures, and the conductive path-forming parts in the second anisotropically conductive sheet each have a diameter smaller than a diameter of each of the conductive pathforming parts in the first anisotropically conductive sheet.

\* \* \* \* \*